(12) United States Patent
Amit et al.

(10) Patent No.: US 9,329,033 B2
(45) Date of Patent: May 3, 2016

(54) METHOD FOR ESTIMATING AND CORRECTING MISREGISTRATION TARGET INACCURACY

(71) Applicant: KLA-TENCOR CORPORATION, Milpitas, CA (US)

(72) Inventors: Eran Amit, Pardes Hanna-Karkur (IL); Dana Klein, Migdal Ha'emek (IL); Guy Cohen, D.N. Misgav (IL); Amir Widmann, D.N. Hof Hacarmel (IL); Nimrod Shuall, Nofit (IL); Amnon Manassen, Haifa (IL); Nuriel Amir, St. Yokne'am (IL)

(73) Assignee: KLA-Tencor Corporation, Milpitas, CA (US)

( * ) Notice: Subject to any disclaimer, the term of this patent is extended or adjusted under 35 U.S.C. 154(b) by 609 days.

(21) Appl. No.: 13/834,915

(22) Filed: Mar. 15, 2013

(65) Prior Publication Data
US 2014/0060148 A1 Mar. 6, 2014

Related U.S. Application Data

(60) Provisional application No. 61/696,963, filed on Sep. 5, 2012, provisional application No. 61/697,159, filed on Sep. 5, 2012, provisional application No. 61/764,441, filed on Feb. 13, 2013, provisional application No. 61/766,320, filed on Feb. 19, 2013.

(51) Int. Cl.
*G01N 37/00* (2006.01)
*G01B 21/04* (2006.01)
*G03F 7/20* (2006.01)
*G06F 11/30* (2006.01)

(52) U.S. Cl.
CPC .......... *G01B 21/042* (2013.01); *G03F 7/70625* (2013.01); *G03F 7/70633* (2013.01)

(58) Field of Classification Search
CPC .......................... G01B 21/042; G03F 7/70625
See application file for complete search history.

(56) References Cited

U.S. PATENT DOCUMENTS

| | | | |
|---|---|---|---|
| 2005/0188342 A1* | 8/2005 | Goodwin | G03F 7/70633 430/22 |
| 2008/0094630 A1 | 4/2008 | Mieher et al. | |
| 2010/0134778 A1 | 6/2010 | Schoormans et al. | |
| 2010/0175033 A1* | 7/2010 | Adel | G03F 7/705 716/52 |

(Continued)

OTHER PUBLICATIONS

PCT International Search Report and Written Opinion for International Application No. PCT/US2013/058254, dated Dec. 30, 2013, pp. 4-13, Korean Intellectual Property Office, Daejeon Metropolitan City.

(Continued)

*Primary Examiner* — Phuong Huynh
(74) *Attorney, Agent, or Firm* — Joshua D. Isenberg; JDI Patent (57) ABSTRACT

Aspects of the present disclosure describe systems and methods for calibrating a metrology tool by using proportionality factors. The proportionality factors may be obtained by measuring a substrate under different measurement conditions. Then calculating the measured metrology value and one or more quality merits. From this information, proportionality factors may be determined. Thereafter the proportionality factors may be used to quantify the inaccuracy in a metrology measurement. The proportionality factors may also be used to determine an optimize measurement recipe. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims.

17 Claims, 7 Drawing Sheets

(56) References Cited

U.S. PATENT DOCUMENTS

2011/0231167 A1* 9/2011 Cramer ............... G03B 27/52 703/2
2013/0035888 A1 2/2013 Kandel et al.

OTHER PUBLICATIONS

U.S. Appl. No. 61/696,963, entitled "Method for Testing and Correcting Misregistration Target Inaccuracy" to Eran Amit, filed Sep. 5, 2012.

U.S. Appl. No. 61/697,159, entitled "Method for Testing and Correcting Misregistration Target Inaccuracy" to Eran Amit, filed Sep. 5, 2012.

U.S. Appl. No. 61/764,441, entitled "Method for Testing and Correcting Misregistration Target Inaccuracy" to Eran Amit, filed Feb. 13, 2013.

U.S. Appl. No. 61/766,320, entitled "Method for Testing and Correcting Misregistration Target Inaccuracy" to Eran Amit, filed Feb. 19, 2013.

* cited by examiner

METHOD FOR ESTIMATING AND CORRECTING MISREGISTRATION TARGET INACCURACY

CLAIM OF PRIORITY

This application claims the priority benefit of commonly owned, co-pending U.S. Provisional Patent Application No. 61/696,963, to Eran Amit et al, filed Sep. 5, 2012, and entitled "METHOD FOR ESTIMATING AND CORRECTING MISREGISTRATION TARGET INACCURACY" the entire disclosures of which are incorporated herein by reference.

This application claims the priority benefit of commonly owned, co-pending U.S. Provisional Patent Application No. 61/697,159, to Eran Amit et al, filed Sep. 5, 2012, and entitled "METHOD FOR ESTIMATING AND CORRECTING MISREGISTRATION TARGET INACCURACY" the entire disclosures of which are incorporated herein by reference.

This application claims the priority benefit of commonly owned, co-pending U.S. Provisional Patent Application No. 61/764,441, to Eran Amit et al, filed Feb. 13, 2013 and entitled "METHOD FOR ESTIMATING AND CORRECTING MISREGISTRATION TARGET LAYER INACCURACY" the entire disclosures of which are incorporated herein by reference.

This application claims the priority benefit of commonly owned, co-pending U.S. Provisional Patent Application No. 61/766,320, to Eran Amit et al, filed Feb. 19, 2013 and entitled "METHOD FOR ESTIMATING AND CORRECTING MISREGISTRATION INACCURACY BASED ON LOT OPTIMIZATION" the entire disclosures of which are incorporated herein by reference.

FIELD OF THE INVENTION

Aspects of the present disclosure relate to metrology measurements and more particularly, to apparatuses and methods for determining the systematic misregistration errors of targets in an overlay measurement.

BACKGROUND OF THE INVENTION

The fabrication of semiconductor devices, such as logic and memory devices, typically includes a large number of processing steps to form various features and multiple layers. For example, layers may be formed with a lithography process. Lithography is performed by transferring a pattern from a reticle to a resist arranged on a semiconductor substrate. Metrology processes may be used between lithography processing steps, or any other processing steps, in order to monitor the accuracy of the semiconductor fabrication. For example, metrology processes may measure one or more characteristics of a wafer such as the dimensions (e.g., line width, thickness, etc.) of features formed on the wafer during a process step. Overlay error is an example of a characteristic that is of critical importance. An overlay measurement generally specifies how accurately a first patterned layer aligns with respect to a second patterned layer disposed above or below it or how accurately a first pattern aligns with respect to a second pattern disposed on the same layer. The overlay error is typically determined with an overlay target having structures formed on one or more layers of the semiconductor substrate. If the two layers or patterns are properly formed, then the structure on one layer or pattern tends to be aligned with the structure on the other layer or pattern. If the two layers or patterns are not properly formed, then the structure on one layer or pattern tends to be offset or misaligned relative to the structure on the other layer or pattern.

The overlay error can be separated into two components: (1) random errors; and (2) systematic errors. Random errors, such as precision, may be averaged out through measurement of an adequately large sample size. However, the systematic errors cannot be removed through the use of averaging, because they are the result of inherent biases in a target, the substrate itself, the measurement tool, or any combination thereof. For example, a target may have an asymmetrical shape that influences the accuracy of the overlay error. A detailed description of the effect asymmetrical shape has on the overlay error is provided in commonly owned U.S. patent application Ser. No. 13/508,495, entitled METHOD AND SYSTEM FOR PROVIDING A QUALITY METRIC FOR IMPROVED PROCESS CONTROL, filed May 7, 2012, by Daniel Kandel et al. which is incorporated herein in its entirety.

As a result, it is desirable to provide a system and method suitable for mitigating the impact of the systematic overlay errors. It is within this context that embodiments of the present invention arise.

SUMMARY OF THE INVENTION

According to aspects of the present disclosure, a method for generating one or more proportionality factors suitable for calibrating a metrology tool may be executed by obtaining a plurality of metrology measurement signals for each measurement location of a plurality of measurement locations distributed across a substrate. Each of the plurality of measurement signals obtained for each measurement location may be generated by a metrology tool measuring the measurement location with one of a plurality of different measurement conditions. Then the process may continue by determining a measured metrology value and one or more quality merits for each measurement signal. Next, the quality merits and measured metrology values may be used to determine proportionality factors that each correspond to one of the plurality of different measurement conditions. Thereafter, the metrology tool may be calibrated to use the proportionality factor that corresponds to the measurement condition used to measure subsequent targets when generating subsequent metrology measurement values.

According to an additional aspect of the present disclosure, the method may further comprise instructions for comparing the proportionality factors that correspond to each of the measurement conditions to determine which combination of measurement conditions produces an optimized measurement recipe, and thereafter instructing the metrology tool to utilize the optimized measurement recipe in subsequent metrology measurements.

According to aspects of the present disclosure, the measurement conditions may be, but are not limited to, different color filters, different focus positions, different light polarizations, or different target types. According to yet additional aspects of the present disclosure, the metrology tool may be, but is not limited to, an overlay measurement tool, a critical dimension measurement tool, or a three-dimensional shape measurement tool. According to yet additional aspects of the present disclosure, the measured metrology values may be, but are not limited to, overlay measurements.

According to an additional aspect of the present disclosure, a method for associating proportionality factors with target defects with a metrology tool is described. The method comprises the steps of obtaining a metrology signal from a target that has a known defect, where the metrology tool uses the first measurement condition to generate the metrology signal. Then the method continues by calculating one or more quality merits for the metrology signal. Thereafter the method may continue by associating a combination of the one or more quality merits and proportionality factors with the known defect. Then the method may include the step of storing the association in a defect database.

According to yet another additional aspect of the present disclosure, a method for detecting target defect types with a metrology tool is described. The method may comprise the steps first generating one or more measurement signals by measuring one or more targets on a substrate according to a measurement recipe where at least one measurement condition in the measurement recipe has a known proportionality factor. Then the method may require generating one or more quality merits for each of the one or more measurement signals. Thereafter the method may continue by comparing a combination of the known proportionality factors and the one or more quality merits with a set of stored proportionality factor and quality merit combinations that have been associated with a target defect in a defect database.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention. Additionally, because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention.

In this document, the terms "a" and "an" are used, as is common in patent documents, to include one or more than one. In this document, the term "or" is used to refer to a nonexclusive "or," such that "A or B" includes "A but not B," "B but not A," and "A and B," unless otherwise indicated. The following detailed description, therefore, is not to be taken in a limiting sense, and the scope of the present invention is defined by the appended claims. "Optional" or "optionally" means that the subsequent described circumstance may or may not occur, so that the description includes instances where the circumstance occurs and instances where it does not. For example, if a device optionally contains a feature A, this means that the feature A may or may not be present, and thus, the description includes both structures wherein a device possesses the feature A and structures wherein the feature A is not present.

Aspects of the present disclosure describe systems and methods that enable improved error estimation in metrology measurements. Specifically, aspects of the present disclosure describe metrology measurements that enable improved error estimation in overlay measurements. However, it should be noted that additional metrology measurements may also benefit from aspects of the present disclosure, and the use of overlay measurements is merely illustrative of a specific aspect of the present invention.

According to certain aspect of the present disclosure, the overlay error for each target that is measured by an overlay tool ($OVL_{meas}$) is assumed to be the combination of two components. The first component is the accurate measurement ($OVL_{acc}$). $OVL_{acc}$ is a robust measurement with respect to any measurement method. The $OVL_{acc}$ is robust because for any measurement there must be an accurate value of the measurement, even if it cannot be directly measured. As such, $OVL_{acc}$ will always be the same, regardless of the measurement recipe used by the metrology tool. Therefore, the second component is necessarily the measure of the inaccuracy. According to this assumption the measured overlay may be described by Equation 1.

$$OVL_{meas} = OVL_{acc} + \text{Inaccuracy} \qquad (\text{Eq. 1})$$

In order to determine $OVL_{acc}$ it is therefore necessary to determine the value of the inaccuracy for each target. The inaccuracy is a response function of the measurement method to the target and/or system imperfections. Generally, the inaccuracy may be modeled by Equation 2, however it is recognized herein that the function of Equation 2 is not limited to linear relationships and should merely be interpreted as illustrative. It is anticipated that the function of Equation 2 may take on a variety of mathematical forms.

$$\text{Inaccuracy} = \alpha * Q\text{merit} \qquad (\text{Eq. 2})$$

Where Qmerit is a quality merit and $\alpha$ is a proportionality factor. The Qmerit may be calculated for each target that has been measured. The calculation of quality merits is described in detail in commonly owned U.S. patent application Ser. No.

13/508,495, entitled METHOD AND SYSTEM FOR PROVIDING A QUALITY METRIC FOR IMPROVED PROCESS CONTROL, filed May 7, 2012, by Daniel Kandel et al, and incorporated herein in its entirety. The proportionality factor α is a real number and is unique for each measurement condition and imperfection type. As used herein, the phrase "measurement condition" refers to a parameter used by the metrology tool in order to obtain the measurement signal. By way of example, and not by way of limitation, measurement conditions may include the choice of a color filter, focus position, polarization, illumination angle, or target type. As used herein, the phrase "measurement signal" refers to the signal detected by a metrology tool that corresponds to a real world characteristic of the substrate being measured. By way of example, a digital image (or a set of signals used to produce a digital image) used to analyze overlay error may be the measurement signal. The combination of multiple measurement conditions may be referred to as a "measurement recipe". As used herein the phrase "imperfection type" refers to defects in a target such as, but not limited to, side wall angle asymmetry, target thickness variation, or measurement system imperfections.

Therefore, once the proportionality factor α for various measurement conditions and imperfection types is known, the Inaccuracies of future measurements may be determined. Additionally, once the proportionality factor α for each measurement condition is known, an optimized measurement recipe may be developed. According to an additional aspect of the present disclosure, the proportionality factors α may be cataloged in a database for future defect identifications. Since each defect type is identifiable by a unique a, the appearance of an a that has been associated with a given defect type may then be used as an identifier for that specific defect. As such, aspects of the present disclosure may provide a metrology tool, such as an overlay system, with additional defect identification functionality.

Figure 1A:
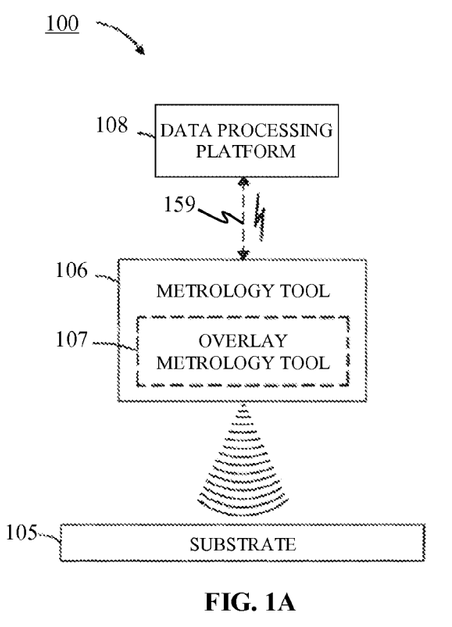
FIG. 1A is a block diagram of a system that may be suitable for determining proportionality factors according to certain aspects of the present disclosure.

FIG. 1A is a block diagram of a system 100 that may be utilized to determine systematic measurement error that occur during metrology measurements of targets 117 on a semiconductor substrate 105. The system 100 may comprise a substrate 105. As used throughout the present disclosure, the term "substrate" generally refers to a substrate formed of a semiconductor or non-semiconductor material. For example, a semiconductor or non-semiconductor material may be, but are not limited to, monocrystalline silicon, gallium arsenide, and indium phosphide. A substrate 105 may include one or more layers. For example, such layers may include, but are not limited to, a resist, a dielectric material, a conductive material, and a semiconductive material. Many different types of such layers are known in the art, and the term substrate as used herein is intended to encompass a substrate on which all types of such layers may be formed.

Figure 1B:
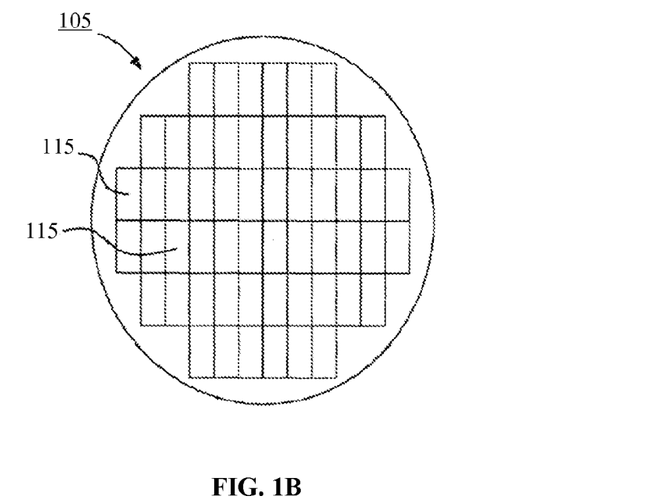
FIG. 1B is an overhead view of a substrate that may be used in the system described in FIG. 1A according to an aspect of the present disclosure.
Figure 1C:
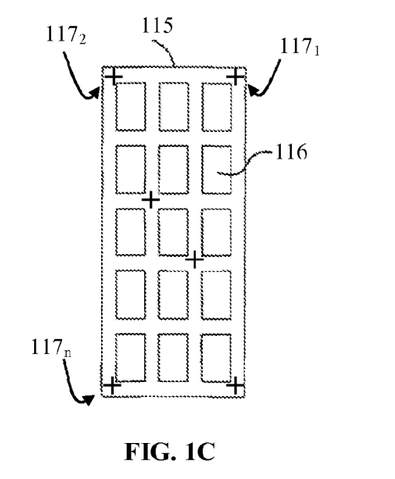
FIG. 1C is a zoomed in view of an exposure field shown in FIG. 1B according to an aspect of the present disclosure.

As shown in FIG. 1B, the substrate 105 may be a semiconductor wafer and may include a plurality of exposure fields 115 that may be utilized by lithography processing tools (e.g. steppers, scanners, etc.). Within each field 115 there may be multiple die 116, as may be seen in a zoomed in image of an exposure field 115 shown in FIG. 1C. A die 116 is the functional unit which eventually becomes a single chip. On production substrates 105, overlay metrology targets 117 are typically placed in the scribeline area (for example in the four corners of the field). This is a region that is typically free of circuitry around the perimeter of the exposure field (and outside the die). In some instances, overlay targets may be placed in the streets, which are regions between the die but not at the perimeter of the field. Engineering and characterization substrate (i.e., a non-production substrates) may have many overlay targets throughout the center of the field 115.

One or more layers formed on a substrate 105 may be patterned or unpatterned. For example, a substrate may include a plurality of dies 116, each having repeatable patterned features. Formation and processing of such layers of material may ultimately result in completed devices. Many different types of devices may be formed on a substrate, and the term substrate as used herein is intended to encompass a substrate on which any type of device known in the art is being fabricated.

System 100 may further comprise a metrology tool 106. As used herein, a metrology tool is any tool that is capable of performing metrology measurements on a substrate 105. By way of example, and not by way of limitation, a metrology measurement may be an overlay measurement that is performed by an overlay measurement tool 107. By way of example, an overlay measurement tool 107 may be any of the overlay metrology systems in the Archer Series available from KLA-Tencor of Milpitas, Calif. It should be noted that while an overlay tool 107 is specified in FIG. 1A, a metrology tool 106 may also be a tool that makes any metrology measurements, such as, but not limited to critical dimension (CD), or three dimensional shape measurements. Additionally, a metrology tool 106 may utilize measurement methods such as, but not limited to, scatterometry, ellipsometry, scanning electron microscopy (SEM), or any combination thereof. Additional metrology tools that may be suitable for aspects of the present disclosure may include, but are not limited to, the SpectraShape Family of metrology tools available from KLA-Tencor of Milpitas, Calif.

Instructions for performing the metrology measurements on the substrate 105 and the processing of metrology signals that may result from the metrology measurements may be performed by a data processing platform 108. The data processing platform 108 may be external to the metrology tool 106, or it may be incorporated into the metrology tool 106.

Figure 1D:
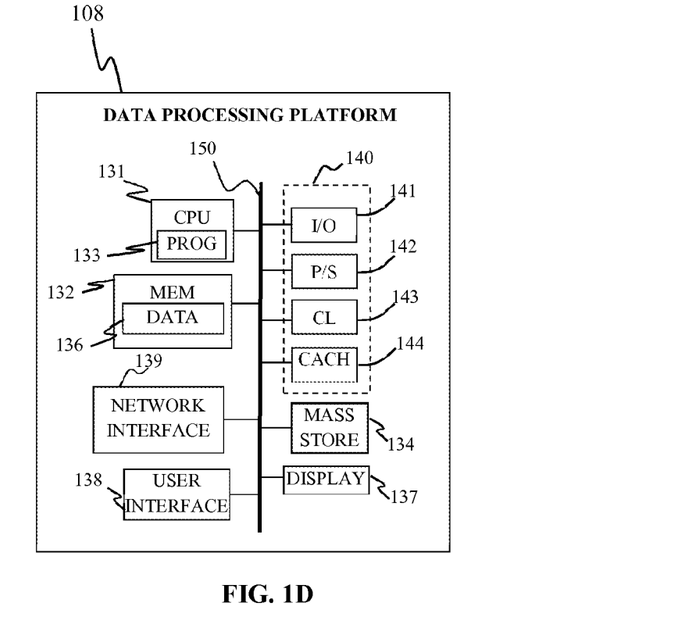
FIG. 1D is a block diagram of a data processing platform that may be used in the system described in FIG. 1A according to an aspect of the present disclosure.

As shown in FIG. 1D, the data processing platform 108 may include a central processor unit (CPU) 131. By way of example, a CPU 131 may include one or more processors, which may be configured according to any suitable processor architecture, e.g., a dual-core, quad-core, multi-core, or Cell processor architecture. The data processing platform 108 may also include a memory 132 (e.g., RAM, DRAM, ROM, and the like). The CPU 131 may execute a process-control program 133, portions of which may be stored in the memory 132. The data processing platform 108 may also include well-known support circuits 140, such as input/output (I/O) circuits 141, power supplies (P/S) 142, a clock (CLK) 143 and cache 144. The data processing platform 108 may optionally include a mass storage device 134 such as a disk drive, CD-ROM drive, tape drive, or the like to store programs and/or data. The data processing platform 108 may also optionally include a display unit 137 and a user interface unit 138 to facilitate interaction between the data processing platform 108 and a user. The display unit 137 may be in the form of a cathode ray tube (CRT) or flat panel screen that displays text, numerals, or graphical symbols. The user interface unit 138 may include a keyboard, mouse, joystick, light pen, or other device. The data processing platform 108 may include a network interface 139, configured to enable the use of Wi-Fi, an Ethernet port, or other communication methods. The network interface 139 may incorporate suitable hardware, software, firmware or some combination of two or more of these to facilitate communication via an electronic communications network 159. The network interface 139 may be configured to implement wired or wireless communication over local area networks and wide area networks such as the Internet. The data processing platform 108 may send and receive data and/or requests for files via one or more data packets over the network 159. The preceding components may exchange signals with each other via an internal system bus 150. The data processing platform 108 may be a general purpose computer that becomes a special purpose computer when running code that implements embodiments of the present invention as described herein. According to aspects of the present disclosure a metrology management system such as, but not limited to the K-T Analyzer available from KLA-Tencor of Milpitas, Calif. may be implanted on or accessible to the data processing platform 108.

Figure 2A:
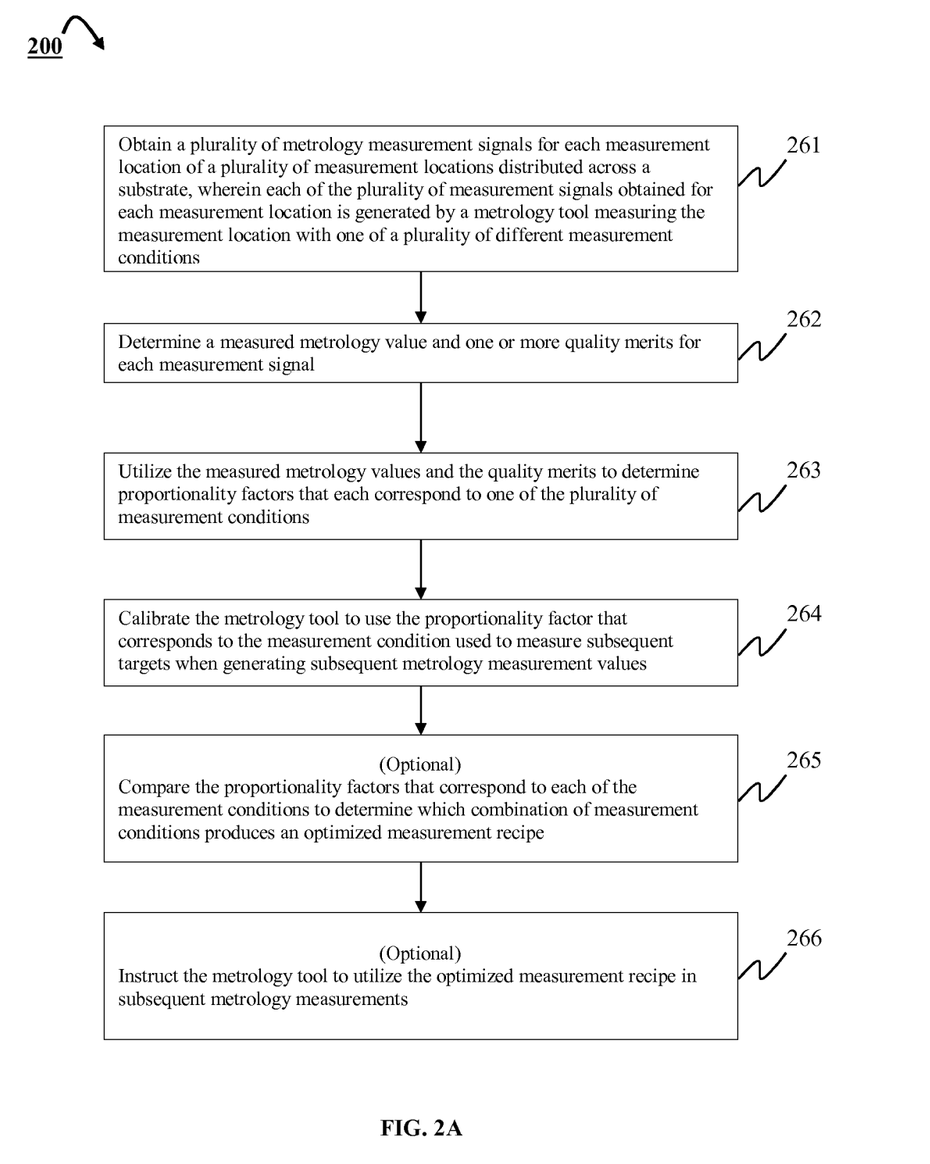
FIG. 2A is flow diagram of a method for calibrating a metrology tool with proportionality factors according to an aspect of the present disclosure.

FIG. 2A is a flow chart that depicts a method 200 that may be used to generate one or more proportionality factors suitable for calibrating a metrology tool according to an aspect of the present disclosure. First at 261 a plurality of metrology measurement signals 221 for each measurement location of a plurality of measurement locations distributed across a substrate may be obtained. The measurement location may be the location of a metrology target 117 that will be measured, or of a location where multiple targets 117 are located proximate to each other. Each of the plurality of measurement signals 221 obtained for each measurement location is generated by a metrology tool 106 measuring the measurement location with one of a plurality of different measurement conditions.

Figure 2B:
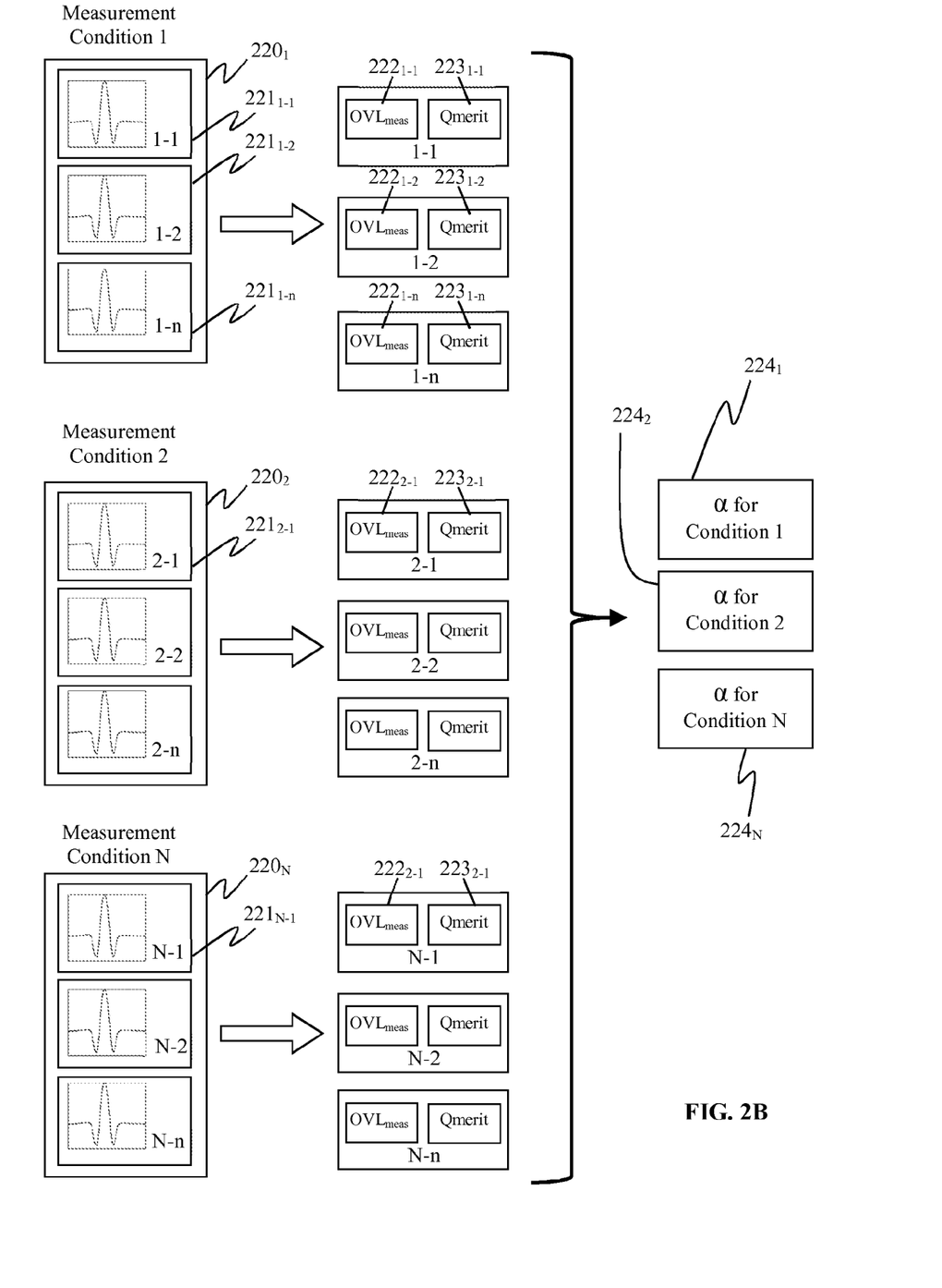
FIG. 2B is a block diagram that may be used in conjunction with the flow diagram in FIG. 2A to describe a method for calibrating a metrology tool with proportionality factors according to an aspect of the present disclosure.

In FIG. 2B, metrology measurements sets 220 are shown contain a plurality of metrology measurement signals 221. By way of example, and not by way of limitation, there may be a number N of measurement sets $220_1$, $220_2$, ... $220_N$. Each measurement set 220 may have a number n of measurement signals. By way of example, measurement set $220_1$ may have measurement signals $221_{1-1}$, $221_{1-2}$, ... $221_{1-n}$ that were produced by the measurement of locations that contain targets $117_2$, $117_2$, and $117_n$ (shown in FIG. 1C) with a first measurement condition. By way of example, and not by way of limitation, the first measurement condition may be the use of green light to perform the measurement. Additionally, second metrology measurement set $220_2$ may include measurement signals $221_{2-1}$, $221_{2-2}$, ... $221_{2-n}$, which are signals that resulted from the measurement of the same targets $117_2$, $117_2$, and $117_N$, but this time measured with a second measurement condition, such as performing the measurement with white light.

Thereafter, at 262 the measured metrology value 222 and one or more quality merits 223 are determined for each measurement signal 221. By way of example, and not by way of limitation, the measured metrology value 222 may be the measured overlay error $OVL_{meas}$. The process of determining the measured metrology value 222 and the one or more quality merits is described in detail in commonly owned U.S. patent application Ser. No. 13/508,495, entitled METHOD AND SYSTEM FOR PROVIDING A QUALITY METRIC FOR IMPROVED PROCESS CONTROL, filed May 7, 2012, by Daniel Kandel et al, and is incorporated herein in its entirety. Briefly, with respect to quality merits for overlay measurement signals, the determination of a quality merit may be accomplished by applying a plurality of overlay algorithms to one or more acquired metrology signals 221 in order to calculate a number of overlay estimates. Then, based on the span, or distribution of these calculated overlay estimates a quality merit 223 for each sampled metrology target 117 of a substrate may be generated.

After the metrology measurement values 222 and quality merits 223 have been determined for each of the sampled targets 117, then proportionality factors that correspond to each of the plurality of measurement conditions may then be determined as shown by block 263 of method 200.

By using the measured metrology values 222 and Qmerits 223 obtained through different measurement conditions, and by using the robustness of $OVL_{acc}$ (which, as described above, is common to all measurement methods), the proportionality factor of each measurement method can be determined by minimizing Equation 3.

$$x^2 = \sum_{n=1}^{N} \sum_{c_1=1}^{N_c} \sum_{c_2=1}^{c_1-1} W_n \left[ \left( OVL_{n,c_1} - \sum_d \alpha_{c_1}^{(d)} Qmerit_{n,c_1}^{(d)} \right) - \left( OVL_{n,c_2} - \sum_d \alpha_{c_2}^{(d)} Qmerit_{n,c1}^{(d)} \right) \right]^2 \quad \text{(Eq. 3)}$$

Where n is the site index of each measurement location, c1 and c2 represent the different $N_c$ measurement conditions and d is the index of the respective merit values (since there may instances where there is more than one merit per site, per measurement condition). $W_n$ is a normalized weighting function that allows different site indexes, n, to have different contributions to the regression. The use of a weighting function may be beneficial when additional information is known about the substrate that may not necessarily be reflected in the quality merits. By way of example, and not by way of limitation, the weighting function may be utilized to provide additional weight to the targets that are located closer to active devices, since their contributions to the equation would typically be more significant. It should also be noted that the overlay measurements and quality merits are different for every site and measurement condition while the proportionality factors are common for the whole sample.

As such, once the proportionality factors have been determined, the method may continue at block 264 by calibrating the metrology tool 106 to use the proportionality factor 224 that corresponds to the measurement condition used to measure subsequent targets when the metrology tool is generating subsequent metrology measurement values. The calibration may automatically adjust subsequent measured metrology values by removing the Inaccuracy portion (Inacc.=α*Qmerit) since the measurement condition will be known and the proper proportionality factor may be applied. By way of example, if the proportionality factor for measurement with green light has been found, then in subsequent measurements that utilize green light, the measurement can be calibrated in order to remove the inaccurate portion of the measurement, thereby presenting only the accurate portion.

Method 200 also optionally includes generating an optimal measurement recipe for use by the metrology tool on subsequent substrates at block 265. While each measurement condition that has a proportionality factor calculated for it may be calibrated, it may also be desirable to utilize measurement conditions that require the least amount of calibration (i.e., the measurement conditions that have the smallest amount of inaccuracy). Therefore, at block 265, the method 200 may continue by comparing the inaccuracy estimations (based on the quality merits and proportionality factors) that correspond to each of the measurement conditions in order to determine which combination of measurement conditions produces an optimized measurement recipe. Thereafter at bock 266, the method 200 may also optionally include instructing the metrology tool 106 to utilize the optimized measurement recipe in subsequent metrology measurements. As used herein, an optimized measurement recipe may include measurement recipes that produce the least amount of inaccuracy, increased measurement throughput or any desired balance between measurement performance (based on conventional TMU definition) and minimization of inaccuracy. However, for the sake of clarity it should be noted that the optimization only changes the recipe, and that the calibration function is not altered. According to additional aspects of the present disclosure, there may be additional optimization done with respect to the choice of target 117 for use in subsequent processing. As described above, the type of target used for the metrology measurement may be one of the measurement conditions. By way of example, and not by way of limitation, the metrology targets may be box-in-box (BiB), advanced imaging metrology (AIM), AIMid, Blossom, or multilayer AIMid metrology targets. The optimized target type for the given process may be found by determining the proportionality factor of each type of target. Instead of measuring a single target with multiple measurement conditions, multiple target types are positioned proximate to each other such that their location may be assumed to be identical. Then, the same measurement conditions may be utilized to measure each of the target types.

Figure 3A:
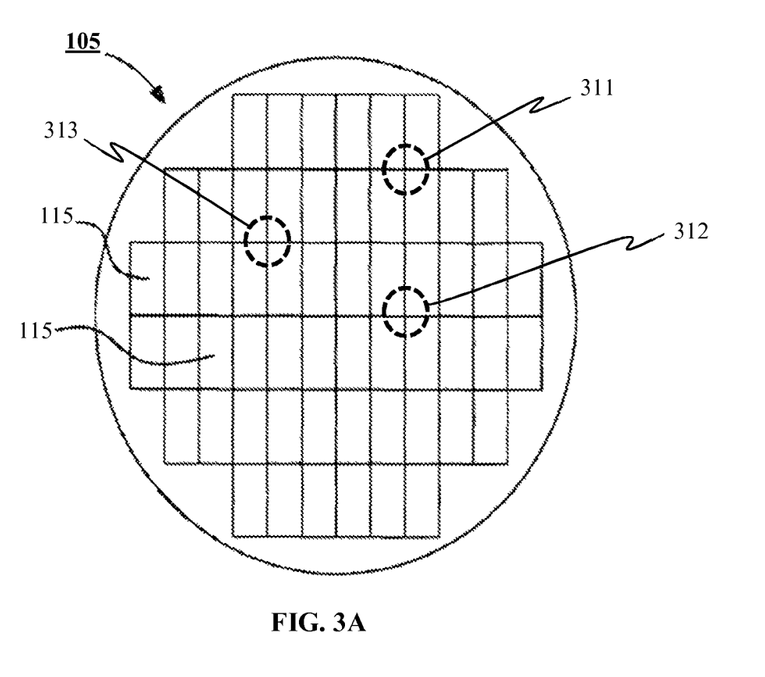
FIG. 3A is an overhead view of a substrate that may be used in conjunction with aspects of the present disclosure where the measurement condition is a target type.
Figure 3B:
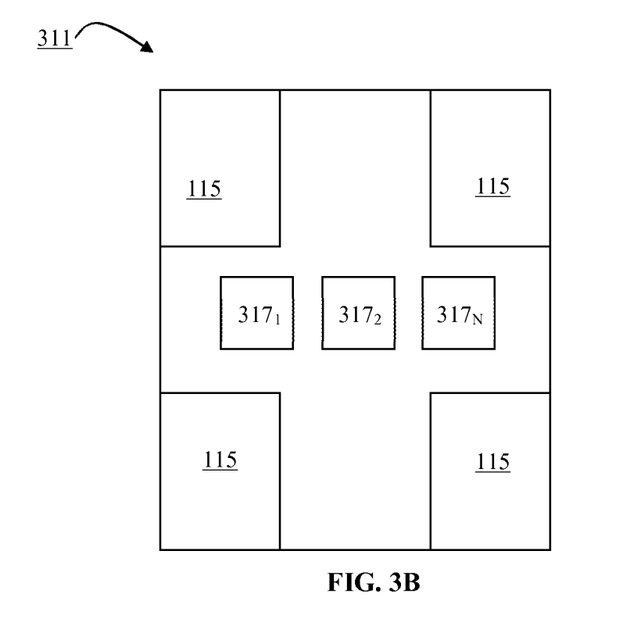
FIG. 3B is a zoomed in overhead view of a region of the substrate of FIG. 3A that may be used in conjunction with aspects of the present disclosure where the measurement condition is a target type.

FIG. 3A is an example of a substrate 105 that has been processed in a manner that allows for the determination of the optimum target type. As may be seen, there are a plurality of locations 311, 312, and 313 on the substrate. At each location there may be a plurality of different types of targets, with each location having the same plurality of targets. As shown in FIG. 3B, location 311 has three different target types ($317_2$, $317_2$, and $317_N$). The targets are formed close enough to each other that they may be assumed to have the same location. By way of example, the targets are close enough together to make the assumption if their overlay differences are smaller than the required precision. Once the targets have been formed on the substrate, a measurement signal 221 is generated for each target. Since it is assumed that the targets located proximate to each other are formed at the same location, multiple measurement signals 221 will be produced for each of the plurality of locations 1-N. Thereafter, the measurement signals 221 may be utilized to determine the proportionality factors for each of the target types in a manner substantially similar to that described in method 200.

According to additional aspects of the present disclosure, proportionality factors may be used to expand the functionality of a metrology tool. Specifically, in an overlay metrology tool, the combination of the accuracy estimation in different measurement conditions and/or different quality metrics may be used to identify the specific defect which affects the target inaccuracy, thereby extending the overlay tool capabilities. According to additional aspects of the present disclosure the proportionality factors alone may also be used to identify the defect types.

Figure 4:
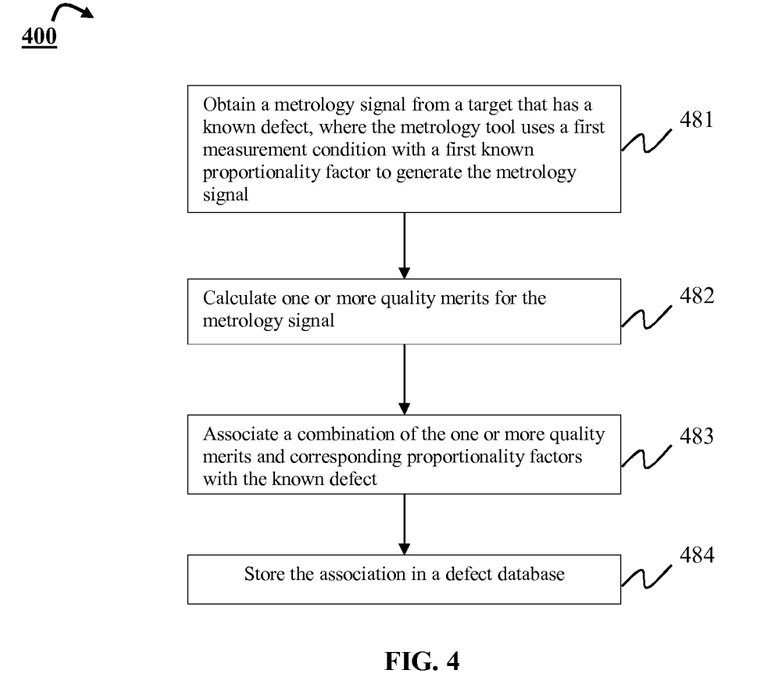
FIG. 4 is a flow diagram of a method that may be used to build associate a target defect type with a proportionality factor according to an aspect of the present disclosure.

FIG. 4 depicts a flow chart of a method 400 that may be used in order to a target defect with a proportionality factor according to an aspect of the present disclosure. First, at box 481 a metrology signal may be obtained from a target that has a known defect, where the metrology tool uses a first measurement condition with a first known proportionality factor to generate the metrology signal. One or more quality merits may then be generated from the resulting metrology signal at box 482. The combination of the measurement condition's proportionality factor and the resulting one or more quality merits may be associated with the known target defect and stored in a target defect database at box 483. Then, at block 484 the association may be stored in a defect database. By way of example, and not by way of limitation, the defect database may be located in a memory on the data processing platform 108. Thereafter, method 400 may be optionally repeated with different measurement conditions in order to generate additional proportionality factor-quality merit combinations that correspond to the known target defect that may also be stored in the defect database.

Figure 5:
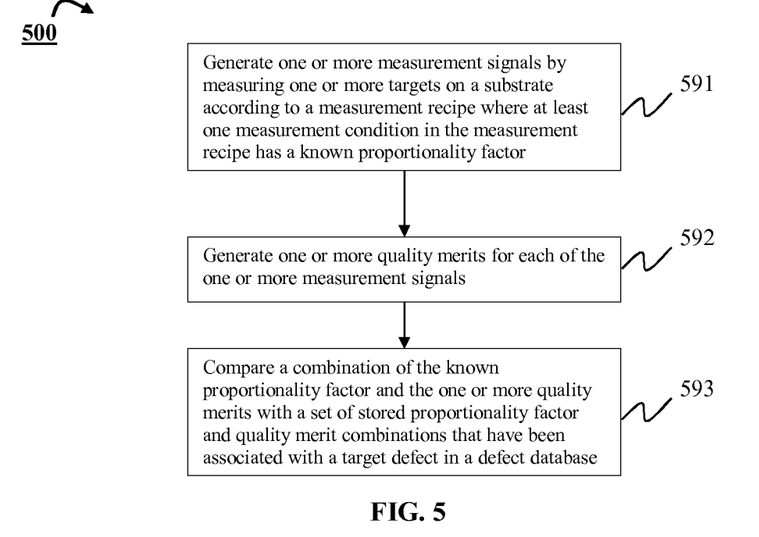
FIG. 5 is a flow diagram of a method that may be used to detect a target defect type with a metrology tool using proportionality factors according to an aspect of the present disclosure.

Once a defect database is established, method 500 in FIG. 5 may be utilized to identify target defects. First at block 591 a metrology system may generate one or more measurement signals by measuring one or more targets on a substrate according to a measurement recipe. At least one of the measurement conditions that are used in the measurement recipe should have a known proportionality factor. At block 592, the measurement signals may be used to generate one or more quality merits for each of the one or more targets. The quality merits may be generated in substantially the same manner as described in the present disclosure and/or applications incorporated into the present disclosure by reference. Then method 500 may continue at block 593 by comparing each measured proportionality factor-quality merit combination with proportionality factor-quality merit combinations that have been stored in the defect database. If a match between any of the measured combinations and the stored combinations is found, then an indication of the defect's presence may be generated.

According to an additional aspect of the present disclosure the Qmerit values may be calculated for each processing layer instead of for each target when using imaged based overlay measurements. The calculation of Qmerit values for each individual layer allows for the analysis of the error attributable to each individual layer instead of assuming that a single layer is responsible for substantially all of the error in the overlay measurement. In order to allow for analysis of each individual layer a formula similar to Equation 3 may be used except that some of the Qmerit values may be calculated for the current layer, some for the previous layer and some for a combination of layers. Equations 4-6 show the adjustments that may be made in order to implement aspects of the present disclosure that analyze multiple layers.

First, in Equation 4, the OVL measurement in Equation 1 is altered by expanding the Inaccuracy portion to include multiple layers, L.

$$OVL_{meas} = OVL_{acc} + \sum_L Inacc_L \quad \text{(Eq. 4)}$$

Where $OVL_{meas}$ is the measured overlay, $OVL_{acc}$ is the calibrated overlay, Inacc stands for the inaccuracy attributable to different layers. The inaccuracy for a layer L is estimated using the Qmerits calculated for that layer. The simplest estimation of the Inacc for a layer L using measurement conditions c is shown in Equation 5, though it should be noted that aspects of the present disclosure are not limited to a linear relationship between alpha and Qmerit.

$$Inacc_{L,c} = \sum_d \alpha_{L,c}^{(d)} Qmerit_{L,c}^{(d)} \quad \text{(Eq. 5)}$$

Where d marks the overlay calculation method. In order to find the proportionality factors α, some sample of the wafer is measured in different measurement conditions and the by the minimization of Equation 6.

$$\chi^2 = \sum_{n=1}^{N} W_n \sum_{c_1=1}^{Nc} \sum_{c_2=1}^{c_1-1} \left[ \left( OVL_{n,c_1} - \sum_L Inacc_{L,c_1,n} \right) - \left( OVL_{n,c_2} - \sum_L Inacc_{L,c_2,n} \right) \right]^2 \qquad \text{(Eq. 6)}$$

Where n is the site index, $c_1$ and $c_2$ represent the different Nc measurement conditions and L is the layer index. $W_n$ is a normalized weighting function that allows different site indexes, n, to have different contributions to the regression. Note that the overlay and merits are different for every site and measurement condition while the proportionality factors are common for the whole sample.

Knowing the target inaccuracy error for each measurement type enables the reduction of this term from the measured overlay, which results in more accurate overlay values; the tool is calibrated to overcome these imperfection errors. In addition multi-layer analysis allows for the estimation of the inaccuracy error of each method and therefore the best measurement conditions for each separate layer may be identified. Additionally, the accuracy of each of the target's elements (for example each of the eight bars of Box in Box target) may be calculated independently using a method substantially similar to the one described above.

According to yet another additional aspect of the present disclosure, instead of measuring the same substrate with different conditions, a calibration may be performed by measuring multiple substrates from the same lot with the same measurement conditions. Since the substrates are from the same lot, it may be assumed that the accurate overlay at the same substrate position will be the same for all substrates while the $OVL_{meas}$ and Qmerit values may be different. Using these assumptions, in combination with the assumption that the same alpha can be used for all substrates, allows for the alpha value to be found by minimizing Equation 7.

$$\chi^2 = \sum_{n=1}^{N} \sum_{w_1=1}^{N_c} \sum_{w_2=1}^{w_1-1} W_n \left[ \left( OVL_{n,w_1} - \sum_d \alpha^{(d)} Qmerit_{n,w_1}^{(d)} \right) - \left( OVL_{n,w_2} - \sum_d \alpha^{(d)} Qmerit_{n,w1}^{(d)} \right) \right]^2 \qquad \text{(Eq. 7)}$$

Where $w_1$ and $w_2$ are notations for different substrates and n is the site index. Note that the same alphas are used for all wafers and that there is only one free parameter per quality merit. The use of calibrating the overlay measurement by taking measurements on multiple substrates in a lot allows for a reduction in the number of samples that are needed per substrate. Further, calibration by taking measurements on multiple substrates in a lot does not required additional measurements besides those which are already part of the fab process monitoring sampling plan.

According to an additional aspect of the present disclosure, it may be assumed that the overlay model should be the same instead of assuming that the raw overlay value is the same. As such, the calibration may be used to optimize the matching between the overlay models based on measurements obtained using different measurement conditions in a manner substantially similar to alternative aspects of the present disclosure.

According to yet another additional embodiment of the present disclosure, if there is at least one reference source, then optimization of the measurement conditions may be made in order to minimize the difference between a metrology tool measurement and the reference. By way of example, and not by way of limitation, the references may be from Etest, TEM, CDSEM or the after etch data (which may be used to calibrate the after develop measurements). With respect to Equations 3 and 7, a reference may be considered to be one of the measurement conditions "C" and have a corresponding Qmerit value of zero.

According to yet another additional aspect of the present disclosure, calibration functions may be found for a plurality of different metrology tools in order to get a reported value which is common for each metrology technique used. This may be useful when several metrology tools are used to measure the same value, but they each report a different value and possibly their own quality merit. In order to implement calibration across a plurality of metrology tools, each measurement tool is treated as if it were a separate measurement condition "C" in Equations 3 or 7. By way of example, and not by way of limitation, the different measurement tools may each measure a value with techniques such as imaging, scatterometry, CDSEM, TEM, or any other metrology measurement. Additionally, this aspect of the present disclosure may be combined with other aspects described in the present disclosure. By way of example, and not by way of limitation, within any of the metrology tools used to make a measurement, there may be a plurality of different measurement conditions that may be used according to alternative aspects of the present disclosure.

Figure 6A:
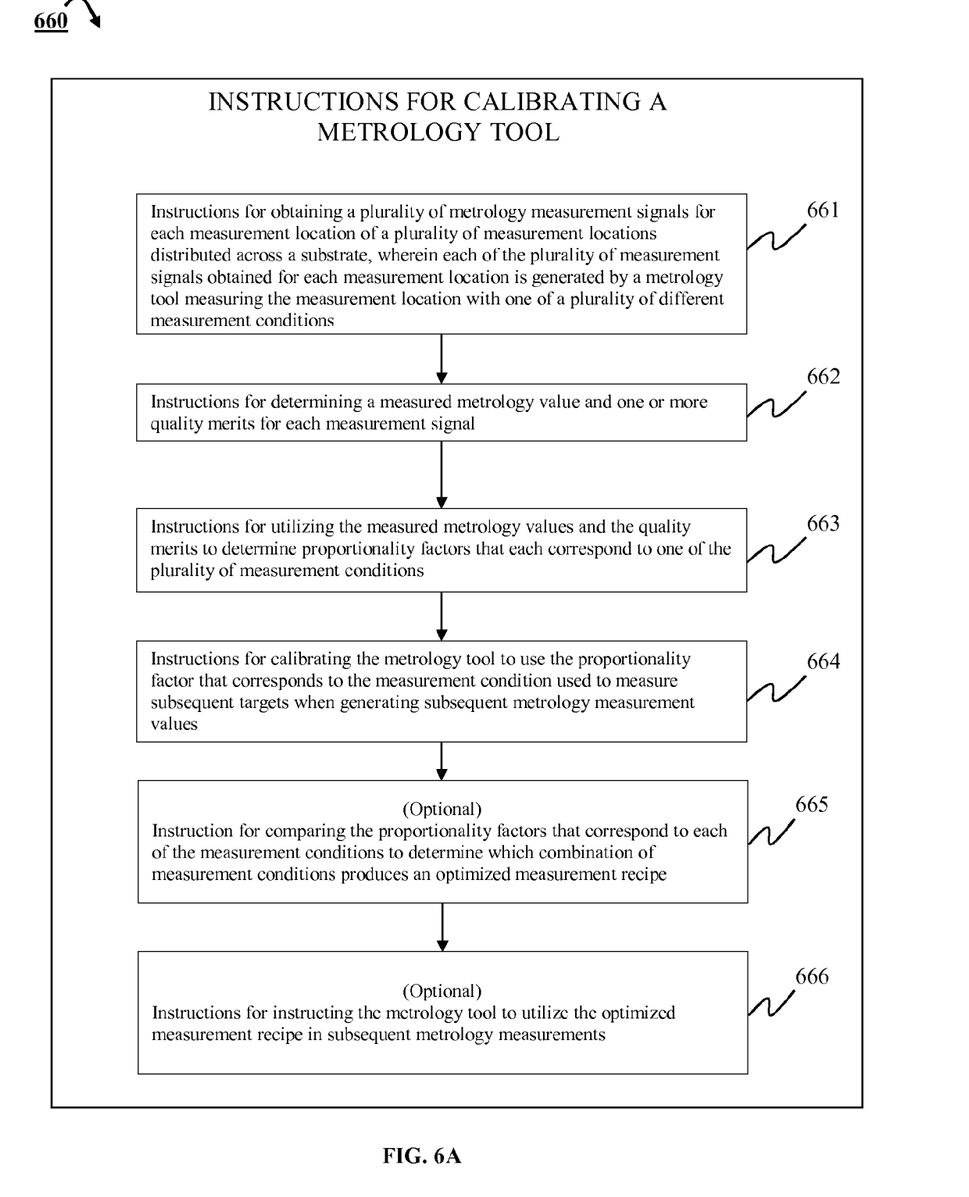
FIG. 6A-6C are block diagrams illustrating program instructions that may be used to implement various aspects of the present disclosure.

As shown in FIG. 6A, a set of system instructions 660 for calibrating a metrology tool may be implemented, e.g., by the data processing platform 108. The processing platform 108 may retrieve the instructions 660 in executable form from a nontransitory computer readable medium such as the memory 132 or the mass storage device 134. The system instructions 660 may also be part of the process control program 133. The instructions include instructions for obtaining a plurality of metrology measurement signals for each measurement location of a plurality of measurement locations distributed across a substrate, wherein each of the plurality of measurement signals obtained for each measurement location is generated by a metrology tool measuring the measurement location with one of a plurality of different measurement conditions at block 661. Then at block 662 there may be instructions for determining a measured metrology value and one or more quality merits for each measurement signal. At block 663 there may be instructions for utilizing the measured metrology values and the quality merits to determine proportionality factors that each correspond to one of the plurality of measurement conditions. Next, at block 664 there may be instructions for calibrating the metrology tool to use the proportionality factor that corresponds to the measurement condition used to measure subsequent targets when generating subsequent metrology measurement values. Optionally at block 665 there may be instructions for comparing the proportionality factors that correspond to each of the measurement conditions to determine which combination of measurement conditions produces an optimized measurement recipe. Finally at block 666 there may be instructions for instructing the metrology tool to utilize the optimized measurement recipe in subsequent metrology measurements.

Figure 6B:
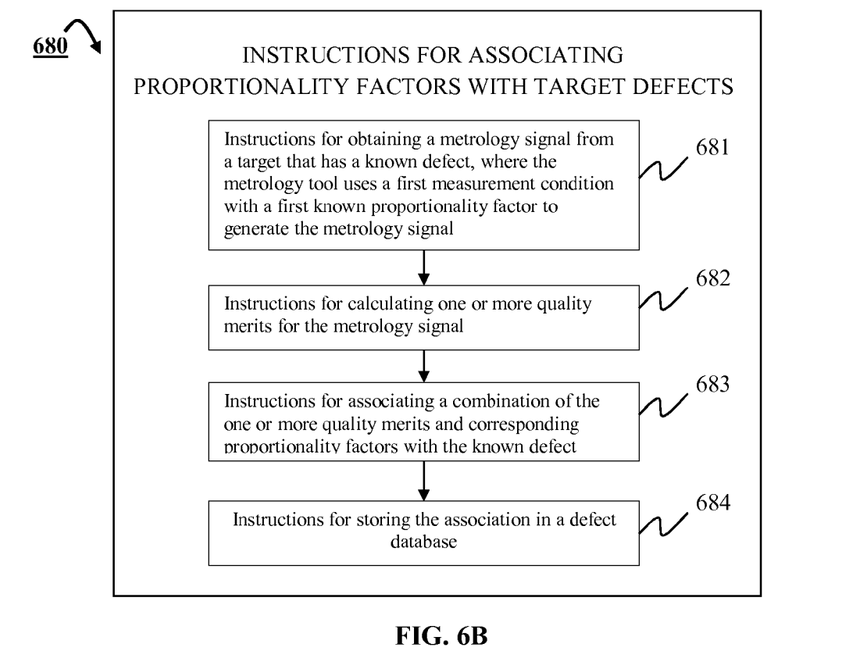

As shown in FIG. 6B, a set of system instructions 680 for associating proportionality factors with target defects may be implemented, e.g., by the data processing platform 108. The processing platform 108 may be formed on a nontransitory computer readable medium such as the memory 132 or the mass storage device 134. The system instructions 680 may also be part of the process control program 133. At block 681 there may be instructions for obtaining a metrology signal from a target that has a known defect, where the metrology tool uses a first measurement condition with a first known proportionality factor to generate the metrology signal. Then at block 682 there may be instructions for calculating one or more quality merits for the metrology signal. Next at block 683 there may be instructions for associating a combination of the one or more quality merits and the corresponding one or more proportionality factors with the known defect. Finally, at block 684 there may be instructions for storing the association in a defect database.

Figure 6C:
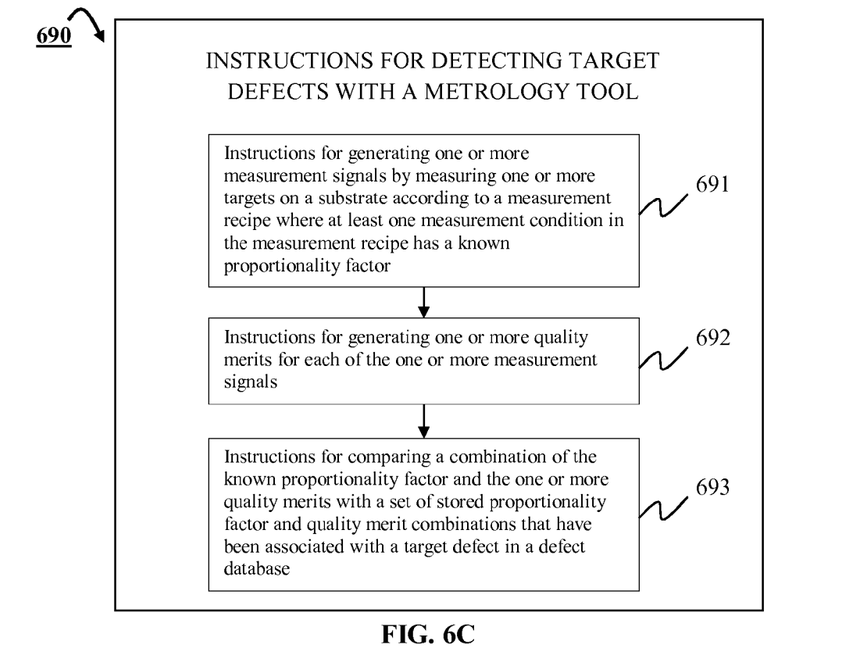

As shown in FIG. 6C, a set of system instructions 690 for detecting target defects with a metrology tool may be implemented, e.g., by the data processing platform 108. The processing platform 108 may be formed on a nontransitory computer readable medium such as the memory 132 or the mass storage device 134. The system instructions 690 may also be part of the process control program 133. First, at block 691 there may be instructions for generating one or more measurement signals by measuring one or more targets on a substrate according to a measurement recipe where at least one measurement condition in the measurement recipe has a known proportionality factor. Next, at block 692 there may be instructions for generating one or more quality merits for each of the one or more measurement signals. Finally, at block 693 there may be instructions for comparing a combination of the known proportionality factor and the one or more quality merits with a set of stored proportionality factor and quality merit combinations that have been associated with a target defect in a defect database.

It should additionally be noted that aspects of the present disclosure provide many benefits with respect to metrology measurements. Specifically, the measurement calibrations are unique to the metrology tool that has been calibrated, and therefor does not rely on processing choices, such as the specific model that is used to describe the overlay. Additionally, the product yield may be improved by utilizing aspects of the present disclosure, because the quantification of the Inaccuracy term is not possible in the prior art. This provides improved accuracy beyond the total measurement uncertainty (TMU). Furthermore, the improvements made possible by aspects of the present disclosure do not require additional metrology targets. Therefore, no extra space on a substrate must be sacrificed to implement aspects of the present disclosure. Also, the calculation of Qmerits and the inaccuracy estimation made possible by the calibration does not add additional time to the metrology measurements, and therefore, the move-acquire-measure (MAM) time is not increased. Further still, aspects of the present disclosure provide improved measurement recipe optimization. Additionally, aspects of the present disclosure make the metrology process "dynamic" in that the metrology tool is capable of adjusting to the small variations in the processing of the substrate. Further, aspects of the present disclosure may allow for identification of target shape with the use of proportionality factors. This is specifically beneficial because identification of target shape may provide the added ability to use aspects of the present disclosure for focus and dose application. And finally, the use of proportionality factors provides extended functionality to metrology tools, such as an overlay tool, since they may now be used to identify specific target defects.

The appended claims are not to be interpreted as including means-plus-function limitations, unless such a limitation is explicitly recited in a given claim using the phrase "means for." Any element in a claim that does not explicitly state "means for" performing a specified function, is not to be interpreted as a "means" or "step" clause as specified in 35 USC §112, ¶ 6. In particular, the use of "step of" in the claims herein is not intended to invoke the provisions of 35 USC §112, ¶ 6.

What is claimed is:

1. A nontransitory computer readable medium containing program instructions for generating one or more proportionality factors suitable for calibrating a metrology tool, and wherein execution of the program instructions by one or more processors of a computer system causes the one or more processors to carry out the steps of:

obtaining a plurality of metrology measurement signals for each measurement location of a plurality of measurement locations distributed across a substrate, wherein each of the plurality of measurement signals obtained for each measurement location is generated by a metrology tool measuring the measurement location with one of a plurality of different measurement conditions;

determining a measured metrology value and one or more quality merits for each measurement signal;

utilizing the measured metrology values and the quality merits to determine proportionality factors that each correspond to one of the plurality of different measurement conditions; and calibrating the metrology tool to use the proportionality factor that corresponds to the measurement condition used to measure subsequent targets when generating subsequent metrology measurement values.

2. The nontransitory computer readable medium of claim 1, further comprising:

comparing the proportionality factors that correspond to each of the measurement conditions to determine which combination of measurement conditions produces an optimized measurement recipe; and instructing the metrology tool to utilize the optimized measurement recipe in subsequent metrology measurements.

3. The nontransitory computer readable medium of claim 2, wherein the optimized measurement recipe minimizes an amount of inaccuracy in the metrology measurement value.

4. The nontransitory computer readable medium of claim 1, wherein the plurality of measurement conditions are different color filters.

5. The nontransitory computer readable medium of claim 1, wherein the plurality of measurement conditions are different focus positions.

6. The nontransitory computer readable medium of claim 1, wherein the plurality of measurement conditions are different light polarizations.

7. The nontransitory computer readable medium of claim 1, wherein the plurality of measurement conditions are different target types.

8. The nontransitory computer readable medium of claim 7, wherein each measurement location comprises a plurality of target types located proximate to each other.

9. The nontransitory computer readable medium of claim 1, wherein the metrology tool is an overlay tool.

10. The nontransitory computer readable medium of claim 9, wherein the measured metrology values are overlay measurements.

11. The nontransitory computer readable medium of claim 1, wherein the metrology tool is a critical dimension metrology tool.

12. The nontransitory computer readable medium of claim 11, wherein the measured metrology value is made with scatterometry.

13. The nontransitory computer readable medium of claim 11, wherein the measured metrology value is made with ellipsometry.

14. The nontransitory computer readable medium of claim 11, wherein the measured metrology value is made with CD-SEM.

15. A metrology tool configured to operate on a network, comprising:
   a processor;
   a memory coupled to the processor;
   one or more instructions embodied in memory for execution by the processor, the instructions being configured to generate one or more proportionality factors suitable for calibrating the metrology tool, the method comprising:
      obtaining a plurality of metrology measurement signals for each measurement location of a measurement locations distributed across a substrate, wherein each of the plurality of measurement signals obtained for each measurement location is generated by a metrology tool measuring the measurement location with one of a plurality of different measurement conditions;
      determining a measured metrology value and one or more quality merits for each measurement signal;
      utilizing the measured metrology values and the quality merits to determine proportionality factors that each correspond to one of the plurality of different measurement conditions; and
      calibrating the metrology tool to use the proportionality factor that corresponds to the measurement condition used to measure subsequent targets when generating subsequent metrology measurement values.

16. A nontransitory computer readable medium containing program instructions for associating proportionality factors with target defects with a metrology tool, and wherein execution of the program instructions by one or more processors of a computer system causes the one or more processors to carry out the steps of:
   obtaining a metrology signal from a target that has a known defect, where the metrology tool uses a first measurement condition with a first known proportionality factor to generate the metrology signal;
   calculating one or more quality merits for the metrology signal;
   associating a combination of the one or more quality merits and proportionality factors with the known defect; and
   storing the association in a defect database.

17. A nontransitory computer readable medium containing program instructions for detecting target defect types with a metrology tool, and wherein execution of the program instructions by one or more processors of a computer system causes the one or more processors to carry out the steps of:
   generating one or more measurement signals by measuring one or more targets on a substrate according to a measurement recipe where at least one measurement condition in the measurement recipe has a known proportionality factor;
   generating one or more quality merits for each of the one or more measurement signals;
   comparing a combination of the known proportionality factor and the one or more quality merits with a set of stored proportionality factor and quality merit combinations that have been associated with a target defect in a defect database.

* * * * *